(12) United States Patent
Akram

(10) Patent No.: US 6,537,842 B2
(45) Date of Patent: Mar. 25, 2003

(54) METHODS FOR FABRICATING PROTECTIVE STRUCTURES FOR BOND WIRES

(75) Inventor: Salman Akram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/944,504

(22) Filed: Aug. 30, 2001

(65) Prior Publication Data

US 2002/0006696 A1 Jan. 17, 2002

Related U.S. Application Data

(60) Continuation of application No. 09/841,923, filed on Apr. 25, 2001, which is a division of application No. 09/590,419, filed on Jun. 8, 2000, now abandoned.

(51) Int. Cl.⁷ ............................................. H01L 21/00
(52) U.S. Cl. .............................. 438/48; 438/50; 438/51
(58) Field of Search ............................... 438/14, 22, 48, 438/50, 51, 52, 53

(56) References Cited

U.S. PATENT DOCUMENTS

| | | |
|---|---|---|
| 4,424,089 A | 1/1984 | Sullivan |
| 4,752,553 A | 6/1988 | Sullivan |
| 5,173,220 A | 12/1992 | Reiff et al. |
| 5,264,061 A | 11/1993 | Juskey et al. |
| 5,278,442 A | 1/1994 | Prinz et al. |
| 5,457,341 A | 10/1995 | West |
| 5,457,878 A | 10/1995 | Rostoker et al. |
| 5,484,314 A | 1/1996 | Farnworth |
| 5,705,117 A | 1/1998 | O'Connor et al. |
| 5,739,588 A | 4/1998 | Ishida et al. |
| 6,154,940 A | 12/2000 | Onishi et al. |
| 6,325,691 B1 * | 12/2001 | Beers et al. ................. 264/401 |
| 6,376,769 B1 | 4/2002 | Chung |

\* cited by examiner

*Primary Examiner*—David Nelms
*Assistant Examiner*—Dung Anh Le
(74) *Attorney, Agent, or Firm*—TraskBritt

(57) ABSTRACT

A method for fabricating a protective structure for bond wires of a semiconductor device assembly which includes sequentially fabricating one or more layers of the protective structure. After a first layer is formed, each subsequent layer is superimposed upon, contiguous with, and mutually adhered to an underlying layer of the protective structure. Such structure may be used to protect the bond wires of a test apparatus, which connect the contact pads of a carrier substrate of the test apparatus to corresponding bond pads of a test substrate. In addition, a fence member may be assembled with or formed on the test substrate to align and receive a semiconductor device and, thereby, to facilitate assembly of the semiconductor device with the test substrate. The fence member can be formed integrally with the protective structures or secured over the protective structures. Stereolithographic processes may be used to fabricate the fence member.

13 Claims, 7 Drawing Sheets

METHODS FOR FABRICATING PROTECTIVE STRUCTURES FOR BOND WIRES

CROSS-REFERENCE TO RELATED APPLICATIONS

This application is a continuation of application Ser. No. 09/841,923, filed Aug. 16, 2001, pending, which is a divisional of application Ser. No. 09/590,419, filed Jun. 8, 2000, pending.

BACKGROUND OF THE INVENTION

Field of the Invention: The present invention relates generally to stereolithography and, more specifically, to the use of stereolithography to fabricate structures on, or components of, semiconductor testing apparatus and to the resulting structures.

State of the Art: In the past decade, a manufacturing technique termed "stereolithography", also known as "layered manufacturing", has evolved to a degree where it is employed in many industries.

Essentially, stereolithography, as conventionally practiced, involves utilizing a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object. Surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and nonmetallic materials. Regardless of the material employed to fabricate objects, stereolithographic techniques usually involve disposition of a layer of unconsolidated or unfixed material corresponding to each layer within the object boundaries. This is followed by selective consolidation or fixation of the material to at least a semisolid state in those areas of a given layer corresponding to portions of the object, the consolidated or fixed material also at that time being substantially concurrently bonded to a lower layer. The unconsolidated material employed to build an object may be supplied in particulate or liquid form and the material itself may be consolidated, fixed or cured, or a separate binder material may be employed to bond material particles to one another and to those of a previously formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size. When a liquid is employed, resolution is highly dependent upon the minimum surface area of the liquid which can be fixed (cured) and the minimum thickness of a layer which can be generated given the viscosity of the liquid and other parameters such as transparency to radiation or particle bombardment (see below) used to effect at least a partial cure of the liquid to a structurally stable state. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography enabled rapid fabrication of molds and prototypes of objects from CAD files. Thus, either male or female forms on which mold material might be disposed could be rapidly generated. Prototypes of objects could be built to verify the accuracy of the CAD file defining the object and to detect any design deficiencies and possible fabrication problems before a design was committed to large-scale production.

In more recent years, stereolithography has been employed to develop and refine object designs in relatively inexpensive materials, and has also been used to fabricate small quantities of objects where the cost of conventional fabrication techniques is prohibitive, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques.

However, to the inventor's knowledge, stereolithography has yet to be applied to mass production of articles in volumes of thousands or millions, or employed to produce, augment or enhance products including other pre-existing components in large quantities, where minute component sizes are involved, and where extremely high resolution and a high degree of reproducibility of results are required.

In the electronics industry, computer chips are typically manufactured by configuring a large number of integrated circuits on a wafer and subdividing the wafer to form singulated devices or dice. Such dice, including so-called "flip-chip" dice, have "solder bumps" or other conductors, or conductive structures, for electrically connecting each die to circuitry external thereto. These conductors are also useful for temporary connection of a die to a test circuit to determine its fitness for the intended use. Tests may be conducted before or after the die has been packaged.

One type of conventional test apparatus that is used to test the electrical characteristics of semiconductor devices includes a carrier substrate, a test substrate positioned on the carrier substrate, and a fence disposed over the test substrate. The carrier substrate includes terminals and electrical traces that lead from the terminals to communicate with test equipment. Terminals of the carrier substrate are wire bonded to contact pads on the test substrate. The contact pads of the test substrate communicate with test pads thereof. The test pads are arranged to correspond to a pattern of conductors, such as solder balls, conductive pillars, bond pads, or other conductive structures of a semiconductor device to be tested. The fence forms an aperture over the test substrate to facilitate alignment of the semiconductor device to be tested relative to the substrate. As a die to be tested is aligned with a test substrate, test pads of the test substrate temporarily mate or contact the conductors of the semiconductor device. Such test apparatus can be configured to test bare or minimally packaged semiconductor dice or packaged semiconductor devices, such as ball grid array (BGA) packages and chip-scale packages (CSPs).

Conventionally, the bond wires of a test apparatus have been covered with a silicone gel or a nonconductive epoxy "glob-top" material. As such materials can flow, the use of such materials typically also requires that external fences or walls be used to contain such materials in the desired locations. Internal fences or walls may also be required to prevent such glob top, silicone, and other materials from flowing onto the test pads of a test substrate, which can prevent the electrical connection of tested semiconductor devices to the test substrate. Otherwise, if flowable materials are used to cover wire bonds, these materials may have to be removed from the test pads or from the conductors of the tested semiconductor device to ensure adequate electrical connections between the test substrate and the semiconductor device assembled therewith.

In other test apparatus, a photoresist material is used to cover the bond wires that connect a test substrate to a carrier substrate. When photoresist materials are used to protect bond wires, the use of a mask and several exposure and developing steps are required.

Accordingly, there is a need for a method of efficiently and effectively protecting the bond wires of semiconductor device test apparatus, as well as protective structures and test apparatus formed by such a method.

SUMMARY OF THE INVENTION

The present invention includes a method of fabricating a protective structure over the bond wires of a semiconductor device assembly, such as the bond wires of the semiconductor device test apparatus that connect test pads of a test substrate to a carrier substrate and, thereby, to the semiconductor device test apparatus. The present invention also includes semiconductor device assemblies so formed.

A test apparatus embodying teachings of the present invention includes a silicon or other known test substrate with test pads on a surface thereof for receiving complementarily arranged conductors, or conductive structures, of a semiconductor device and electrical traces leading from the test pads to peripheral portions of the test substrate. The test pads may be substantially flush with the surface of the test substrate, recessed relative to the surface, or protrude from the surface, depending upon the types of conductors on the semiconductor devices to be tested with the test substrate or upon the configurations of components of the test apparatus that overlie the test substrate.

The test substrate is secured to a carrier substrate and electrical connections are formed between terminals of the carrier substrate and the traces and test pads of the test substrate. Preferably, bond wires are used to establish the electrical connections between the electrical traces of the test substrate and their corresponding terminals of the carrier substrate. The terminals of the carrier substrate are configured to communicate with known semiconductor device testing equipment.

The test apparatus also has protective structures located over the bond wires. The structures formed in accordance with teachings of the present invention may be used to physically protect, seal, and isolate the bond wires of a test apparatus so as to prevent physical damage to and shorting of the bond wires.

A so-called "fence," which has a large opening therethrough, is positioned over the test substrate. The fence and the opening therethrough are configured to seat a semiconductor device face down over the test substrate, aligning the conductors on the semiconductor device with their corresponding test pads of the test substrate. The opening through the fence may substantially expose a contact surface of the test substrate. The opening through the fence may have a plurality of vertically extending slots spaced about the periphery thereof, which provide additional tolerances at the periphery of the opening to facilitate the insertion of semiconductor devices into, and their removal from, the fence.

As another alternative, the fence or the protective structure may include a relatively thin layer that is positionable over the test substrate so as to protect the test substrate from damage during the repeated testing of semiconductor devices. Apertures formed through the thin protective layer of the fence over at least test pads of the test substrate allow for contact between the test pads and corresponding conductors of a die to be tested and may be used to facilitate alignment of the semiconductor device relative to the test substrate.

The present invention employs computer-controlled, 3-D computer-assisted drafting (CAD) initiated, stereolithographic techniques to rapidly form precision layers of material to specific surfaces of a test substrate and carrier substrate of a test apparatus.

In the stereolithographic processes that are useful in the present invention, one or more layers of a photo-curable liquid, referred to herein as a photopolymer, are sequentially placed on or laterally adjacent to the item to be covered, and the liquid photopolymer of each layer is cured to at least a semisolid state by a precisely directed beam of laser radiation at substantially ambient temperature. Multiple superimposed, contiguous, mutually adhered layers, each separately cured, form one or more precision three-dimensional structures of desired dimensions.

For example, a substrate may be covered with a layer of liquid polyimide or other photopolymer which is cured only in particular locations to an at least semisolid state by precisely directed laser radiation at a substantially ambient temperature. As the regions of the layer that are cured by the laser may be selected, photopolymer located over certain regions of the substrate, such as the contact pads thereof, may be left uncured. Thus, apertures may be formed through the protective layer substantially simultaneously with formation of solid regions of a structure. A single layer having a uniform thickness of, for example, about 25 $\mu$m (1 mil) may be formed on the surface of the wafer. Single layers having thicknesses of up to about 10 mil or more may be formed, the maximum possible thickness of each layer being limited only by the maximum depth into the liquid photopolymer that the laser beam can penetrate. Multiple superimposed layers, each separately cured, may be formed to create structure layers of even greater thickness while maintaining a thickness accuracy not achievable by conventional techniques.

In one embodiment of the method, the bond wire protectors and the fence are fabricated on a substrate using precisely focused electromagnetic radiation in the form of an ultraviolet (UV) wavelength laser to fix or cure a liquid material in the form of a photopolymer. However, the invention is not so limited and other stereolithographically applicable materials may be employed in the present invention. The apparatus used in the present invention may also incorporate a machine vision system to locate substrates and features on the substrates, such as bond wires and test pads.

The method of the present invention encompasses the use of all stereolithographic apparatus and the application of any and all materials thereby, including both metallic and nonmetallic materials applied in any state and cured or otherwise fixed to at least a semisolid state to define a three-dimensional layer or layers having identifiable boundaries.

The highly precise stereolithographic process provides accurate alignment of the conductors of a semiconductor device to be tested with the test pads of the test substrate, providing good electrical connection without bump deformation.

The bond wire protectors and the fence may be fabricated separately by use of individual CAD programs. In another embodiment, the fence is formed stereolithographically to be integral with the bond wire protectors.

Alternatively, a fence can be fabricated on the test and carrier substrates by other known processes or fabricated separately from the test apparatus by known processes and subsequently assembled with the test substrate and carrier substrate assembly. As another alternative, a stereolithographically formed fence can be formed separately from the remainder of the test apparatus and then assembled therewith.

Other features and advantages of the present invention will become apparent to those of skill in the art through consideration of the ensuing description, the accompanying drawings, and the appended claims.

BRIEF DESCRIPTION OF THE SEVERAL VIEWS OF THE DRAWINGS

The figures of the application illustrate exemplary embodiments of the invention, wherein the drawings are not necessarily to scale, and wherein like indicia is used for like and similar elements, and wherein:

FIG. 20 is a perspective view of another embodiment of a test apparatus of the invention, showing additional features.

DETAILED DESCRIPTION OF THE INVENTION

Figure 1:
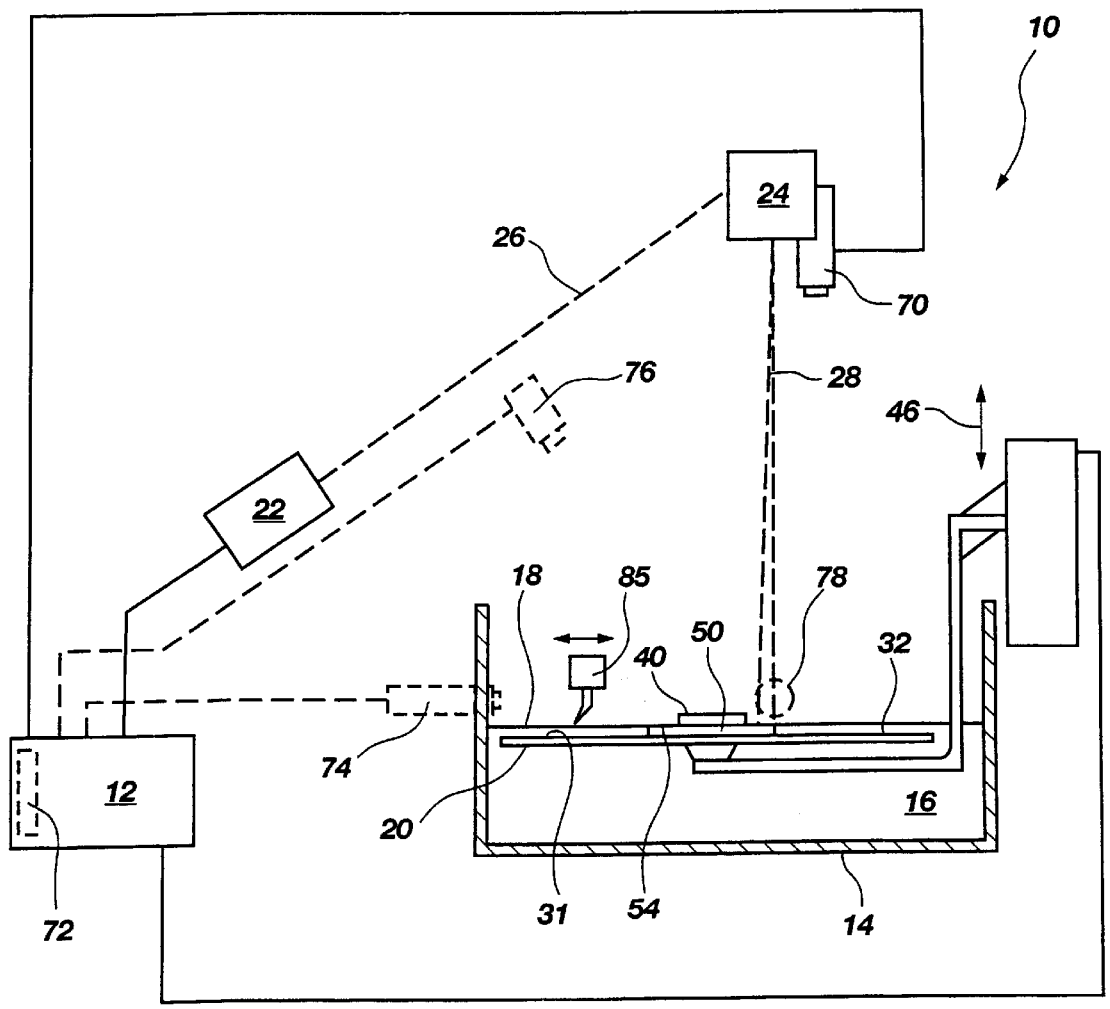
FIG. 1 is a schematic elevation of an exemplary stereolithography apparatus suitable for use in practicing the method of the present invention.

FIG. 1 schematically depicts various components and operation of an exemplary stereolithography apparatus 10 to facilitate the reader's understanding of the technology employed in implementation of the present invention, although those of ordinary skill in the art will understand and appreciate that apparatus of other designs and manufacture may be employed in practicing the method of the present invention. The preferred stereolithography apparatus for implementation of the present invention, as well as operation of such apparatus, are described in great detail in United States Patents assigned to 3 D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,059,359; 5,071,337; 5,076,974; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,850,239; 5,854,748; 5,855,718; 5,855,836; 5,885,511; 5,897,825; 5,902,537; 5,902,538; 5,904,889; 5,943,235; and 5,945,058. The disclosure of each of the foregoing patents is hereby incorporated herein by reference. Improvements in the conventional stereolithographic apparatus, as described in copending application Ser. No. 09/259,143, filed Feb. 26, 1999, and of even assignment, relate to a so-called "machine vision" system in combination with suitable programming of the computer controlling the stereolithographic process. This improvement eliminates the need for accurate positioning or mechanical alignment of workpieces to which material is stereolithographically applied. Alignment of the laser beam or other fixing agent may be item specific (e.g., substrate specific) so that, for example, a plurality of micromachined silicon test substrates 40 may be attached to a carrier substrate 50 and alignment and protective structure 60 (see FIG. 1A) independently formed in selected patterns on each test substrate. Using a machine vision system, accuracy of the process is not dependent on a fiduciary mark 62 (FIG. 2) on a test substrate 40 or on a carrier substrate 50 but on the visual recognition of specific substrate characteristics, such as the locations of test pads 42, bond wires 56, or other features of test substrate 40 or carrier substrate 50.

With reference to FIGS. 1–19 and as noted above, a 3-D CAD drawing of an object such as a protective structure 60 to be fabricated in the form of a data file is placed in the memory of a computer 12 controlling the operation of apparatus 10 if computer 12 is not a CAD computer in which the original structure design is effected. In other words, an object or structure design may be effected in a first computer in an engineering or research facility and the data files transferred via wide or local area network, tape, disc, CD-ROM or otherwise as known in the art to computer 12 of apparatus 10 to fabricate a protective structure 60 or other object comprising one or more applied layers 64 (see FIG. 1A).

Each layer 64 is formed or consolidated from a flowable, curable material 16, which is also referred to herein as liquid material 16, by a pass of the laser beam 28 thereinto. Test substrate 40 has an active surface 38 having test pads 42 thereon. The completed test apparatus 30 comprises test substrate 40, carrier substrate 50, and protective structure 60 formed over bond wires 56 that electrically connect test substrate 40 to carrier substrate 50. The invention relates specifically to the stereolithographic fabrication of protective structure 60 to shield bond wires 56 of a semiconductor test apparatus.

The data for protective structure 60 is preferably formatted in an STL file, STL being a standardized format employed by a majority of manufacturers of stereolithography equipment. Fortunately, the format has been adopted for use in many solid-modeling CAD programs, so translation from another internal geometric database format is often unnecessary. In an STL file, the boundary surfaces of protective structure 60 are defined as a mesh of interconnected triangles.

Apparatus 10 also includes a reservoir 14 (which may comprise a removable reservoir interchangeable with others containing different materials) of liquid material 16 to be employed in applying the intended layer(s) 64 of solidified material to the test substrate 40 and/or carrier substrate 50. In a currently preferred embodiment, liquid material 16 is a photo-curable polymer (hereinafter "photopolymer") responsive to light in the UV wavelength range. The surface level 18 of the liquid material 16 is automatically maintained at an extremely precise, constant magnitude by devices known in the art responsive to output of sensors within apparatus 10 and preferably under control of computer 12. A support platform or elevator 20, precisely vertically movable in fine, repeatable increments in directions 46 responsive to control of computer 12, is located for movement downward into and upward out of liquid material 16 in reservoir 14. A UV wavelength range laser plus associated optics and galvanometers (collectively identified as 22) for controlling the scan of laser beam 26 in the X-Y plane across platform 20 has associated therewith mirror 24 to reflect beam 26 downwardly as beam 28 toward surface 32 of platform 20 or, more particularly, toward active surface 38 of test substrate 40 and toward surface 54 of carrier substrate 50 positioned on surface 32. Beam 28 is traversed in a selected pattern in the X-Y plane, that is to say, in a plane parallel to surface 32, by initiation of the galvanometers under control of computer 12 to at least partially cure, by impingement thereon, selected portions of liquid material 16 disposed over active surface 38 to at least a semisolid state. The use of mirror 24 lengthens the path of the laser beam 26, effectively doubling same, and provides a more vertical beam 28 than would be possible if the laser 22 itself were mounted directly above platform surface 32, thus enhancing resolution.

Data from the STL files resident in computer 12 is manipulated to build protective structure 60 or another object on active surface 38, the surface of another substrate, or on surface 32 of platform 20 one layer at a time. Accordingly, the data mathematically representing protective structure 60 is divided into subsets, each subset representing a layer or slice 64 of protective structure 60. This is effected by mathematically sectioning a 3-D CAD model into a plurality of horizontal layers 64, a "stack" of such layers representing protective structure 60. Each slice or layer may be from about 0.0001 to about 0.0300 inches thick. As mentioned previously, a thinner slice promotes higher resolution by enabling better reproduction of fine vertical surface features of protective structure 60. In some instances, a base support or supports 34 for the object (e.g., test apparatus 30) upon which the protective structure 60 is fabricated may also be programmed as a separate STL file. Such base supports 34 may be fabricated before the overlying protective structure 60 and even prior to the disposal of an object, such as test apparatus 30, on surface 32 of platform 20. Base supports 34 facilitate fabrication of protective structure 60 with reference to a perfectly horizontal plane. Such supports also facilitate removal of the object (e.g., carrier substrate 50 bearing one or more test substrates 40 and protective structures 60 from surface 32 of platform 20). Where a "recoater" blade is employed, as described below, the interposition of base supports 34 precludes inadvertent contact of blade 85 with surface 32.

Before fabrication of protective structure 60 is initiated with apparatus 10, the primary STL file for protective structure 60, the file for the object upon which protective structure 60 is fabricated, and the file for base support(s) 34 are merged. It should be recognized that, while reference has been made to the formation of a single test apparatus 30, protective structures 60 may be concurrently fabricated on multiple test apparatus 30 positioned on surface 32 of platform 20. In such an instance, the STL files for protective structures 60 and base supports 34, if any, are merged. Operational parameters for apparatus 10 are then set, for example, to adjust the size (diameter, if circular) of the laser light beam 28 used to cure liquid material 16.

In the exemplary method described herein, test substrate 40 or carrier substrate 50 may be precisely coated with a structural layer 64 irrespective of substrate size or number of test substrates 40. Thus, current stereolithographic equipment will accommodate objects up to 12 or more inches in X and Y dimensions, and it is expected that equipment size will increase as the need to produce larger groups of test substrates 40 becomes commonplace. Bond wires 56 and other structures may be totally enclosed without introducing any temperature induced or flow-induced bending stresses.

Figure 1A:
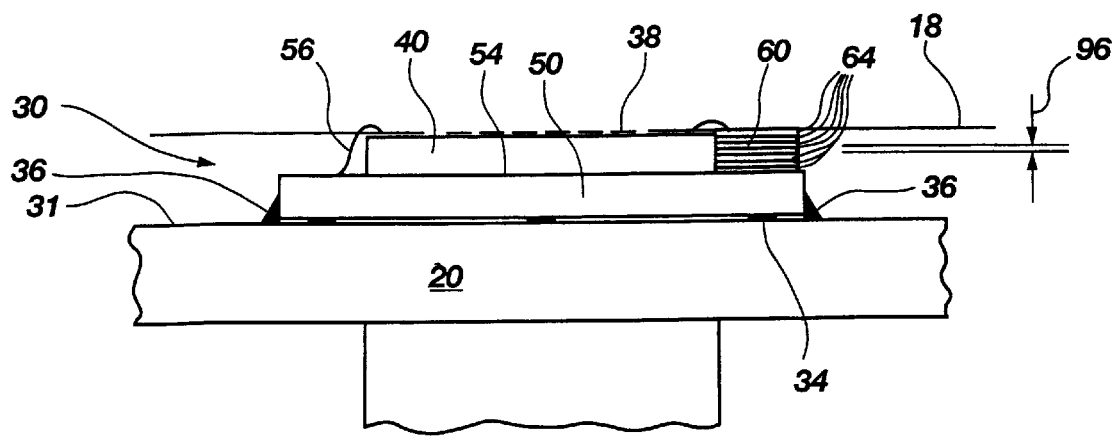
FIG. 1A is an enlarged portion of FIG. 1 showing a structure of the invention being formed in a stereolithographic method of the invention.
Figure 2O:
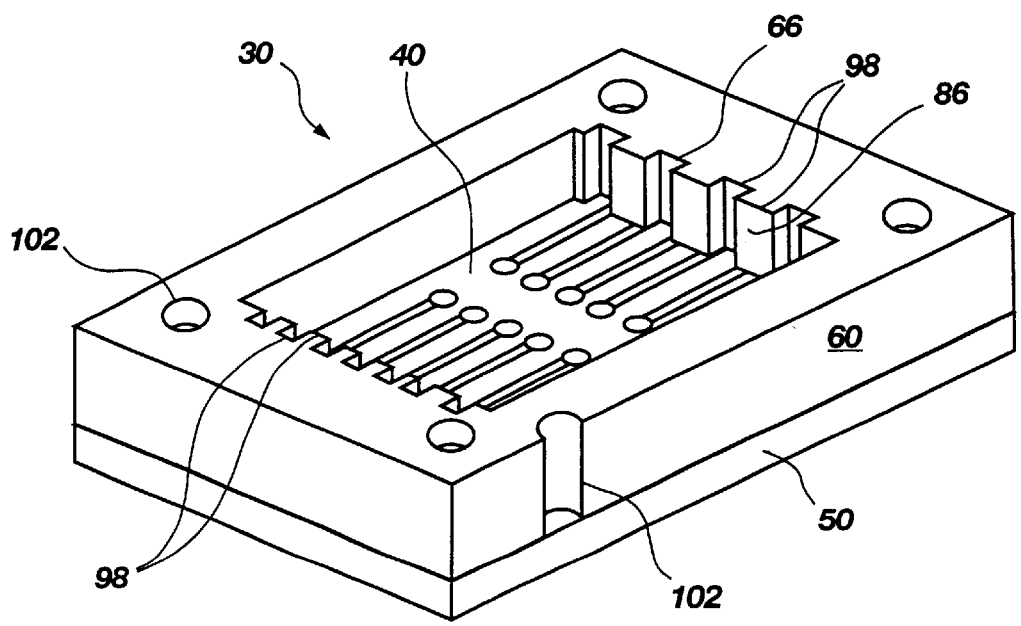

As shown in FIG. 1A, base supports 34 may be placed on platform 20 prior to the placement of test apparatus 30 onto platform 20. In addition, lateral supports 36 may be similarly fabricated to secure test apparatus 30 to platform 20, preventing lateral movement during fabrication of protective structure 60 over bond wires 56 of test apparatus 30. The fabrication of lateral supports 36 can be facilitated by one or more individual STL files or an STL file for lateral supports 36 may be merged with the other STL files for the entire STL process. Alternative methods and apparatus for securing test apparatus 30 to platform 20 and immobilizing test apparatus 30 relative to platform 20 may also be used and are within the scope of the present invention.

Base supports 34 and lateral supports 36 may be formed of an at least partially cured material whose attachment to the platform is readily releasable. Alternatively, a solvent may be used to dissolve the supports 34, 36 to release test apparatus 30 from platform 20 and supports 34, 36. Such release and solvent materials are known in the art. See, for example, U.S. Pat. No. 5,447,822 referenced above and previously incorporated herein by reference.

While the invention is described in terms of a liquid material polymerizable to a semisolid or a solid state, the process may be varied to use a finely divided, powdered material, for example. The term "unconsolidated" will be used herein to denote the unpolymerized material which becomes "altered" or "consolidated" by the laser radiation to an at least semisolid state.

Figure 2:
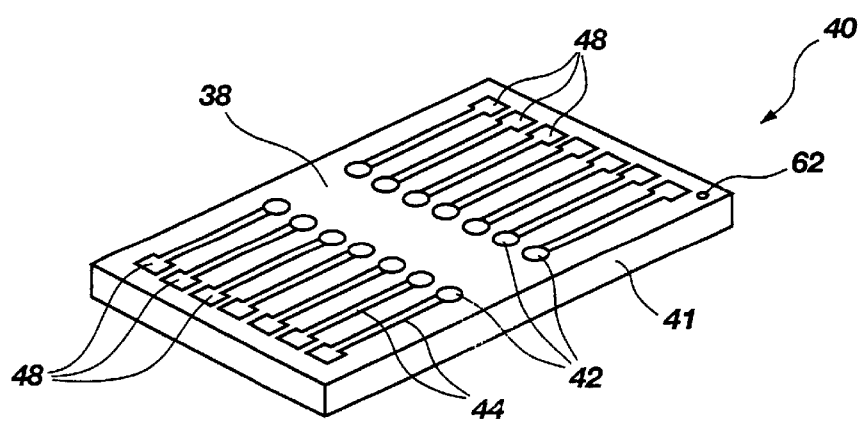
FIG. 2 is a perspective view of an exemplary test substrate useful for forming a test apparatus of the invention for testing a semiconductor flip-chip die.

As shown in FIG. 2, a test substrate 40 includes a layer 41 of silicon upon which conductive test pads 42 are located. Conductive test pads 42 are connected by way of electrical traces 44 to contact pads 48, which are located at or near the periphery of test substrate 40. Test pads 42 may be depressed, raised, or level with active surface 38 of test substrate 40 to accommodate the particular type of semiconductor devices to be tested with test apparatus 30.

Figure 3:
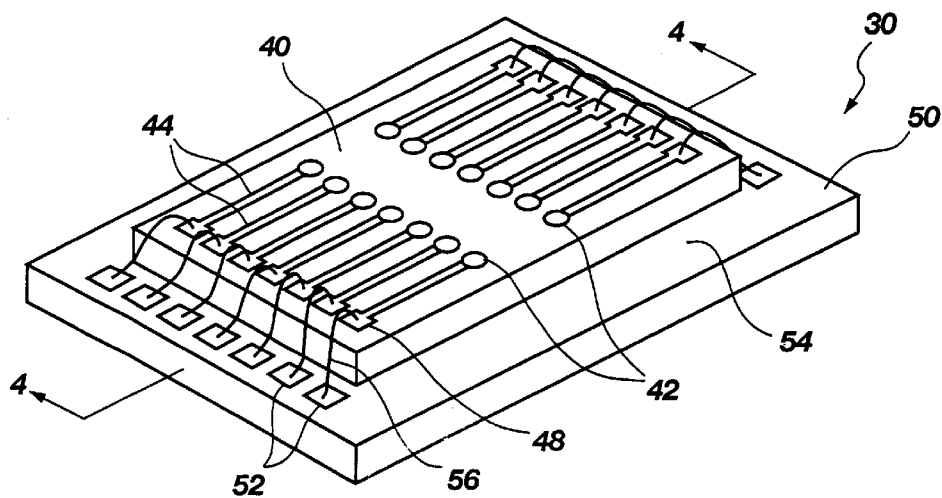
FIG. 3 is a perspective view of an exemplary test substrate joined to a carrier substrate for forming a semiconductor device test apparatus of the invention.
Figure 4:
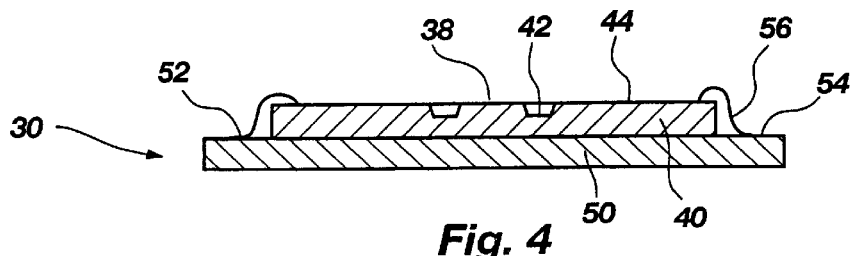
FIG. 4 is a side cross-sectional view of a test substrate joined to a carrier substrate for forming a semiconductor device test apparatus of the invention, as taken along line 4—4 of FIG. 3

As depicted in FIGS. 3 and 4, test substrate 40 is secured on a higher level carrier substate 50, which has contact pads 52 on a surface 54 thereof Contact pads 52 are connected by of bond wires 56 to corresponding contact pads 48 (FIG. 3) of test substate 40. The test substrate 40-carrier substrate 50 assembly is secured to platform 20 of sterolithographic apparatus 10 as already described and shown in FIG. 1A. In FIG. 4, traces 44 and contact pads 52 are shown to illustrate their general location. In the remaining cross-sectional view of FIGS. 6, 8, 10, 11, 13, 15, 17, and 19, traces 44 and contact pads 52 are not shown for the sake of clarity.

Figure 5:
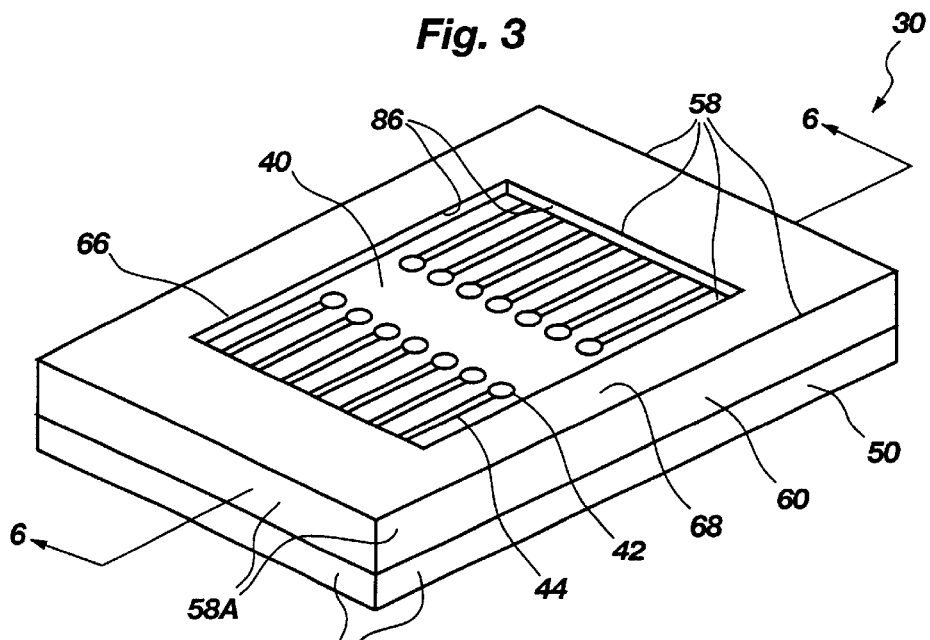
FIG. 5 is a perspective view of a test apparatus of the invention as formed by the method of the inventions.
Figure 6:
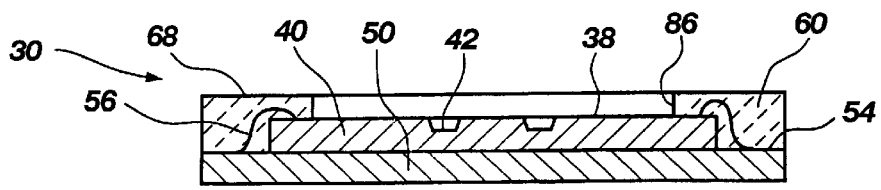
FIG. 6 is a side cross-sectional view of a test apparatus of the invention, as taken along line 6—6 of FIG. 5.

FIGS. 5 and 6 depict test apparatus 30 of FIGS. 3 and 4, upon which a protective structure 60 has been formed, such as by the stereolithographic process disclosed herein.

The position and orientation of each test apparatus 30 on which protective structure 60 is to be formed is located by scanning platform 20 and comparing the features of that test apparatus 30 with corresponding features stored in the data file residing in memory, the locational and orientational data for each test apparatus 30 then also being stored in memory. It should be noted that the data file representing the design size, shape and topography for one or more test apparatus 30 on platform 20 may be used at this juncture to detect those test apparatus 30 which may be physically defective or damaged. It should also be noted that data files for more than one type (size, thickness, configuration, surface topography) of test apparatus 30 may be placed in computer memory and computer 12 programmed to recognize the locations and orientations of test substrates 40 and carrier substrates 50, as well as of test pads 42, contact pads 48, bond wires 56, contact pads 52, and boundaries 58 which define the protective structure 60 which is to be formed, and a laser path for forming protective structure 60.

Data from the STL files resident in computer 12 is manipulated to form one layer 64 at a time on the test apparatus 30 disposed on platform 20. Accordingly, where the final protective structure 60 is formed of a plurality of individually formed layers 64, the data mathematically representing protective structure 60 is divided into subsets, each subset representing a slice or layer 64. This is effected by mathematically sectioning the 3-D CAD model into a plurality of horizontal layers 64, "stacks" of such layers representing protective structures 60. Slices or layers 64 may each be from about 0.0001 to about 0.0300 inch thick. As mentioned previously, a thinner slice promotes higher resolution by enabling better reproduction of fine vertical surface features of protective structure 60.

Before initiation of a first layer 64 for a support 34, 36 or for protective structure 60 is commenced, computer 12 automatically checks and, if necessary, adjusts by means known in the art, the surface level 18 of liquid material 16 in reservoir 14 to maintain same at an appropriate focal length for laser beam 28. U.S. Pat. No. 5,174,931, referenced above and previously incorporated herein by reference, discloses one suitable level control system. Alternatively, the height of mirror 24 may be adjusted responsive to a detected surface level 18 to cause the focal point of laser beam 28 to be located precisely at the surface of liquid material 16 at surface level 18 if level 18 is permitted to vary, although this approach is somewhat more complex. Platform 20 may then be submerged in liquid material 16 in reservoir 14 to a depth equal to the thickness of one layer or slice 64 to be formed on test apparatus 30. The surface level 18 of liquid material 16 can be readjusted as required, such as to accommodate liquid material 16 displaced by submergence of platform 20. Laser 22 is then activated so that laser beam 28 will scan liquid material 16 in a defined path over surface 54 of carrier substrate 50 or active surface 38 of each test substrate 40 of each test apparatus 30, in turn, to at least partially cure (e.g., at least partially polymerize) liquid material 16 at selected locations on each test apparatus 30, including around and over bond wires 56.

Boundaries 58 of protective structure 60 circumscribe test substrate 40 below active surface 38 and circumscribe a central opening 66 above active surface 38 (see FIG. 5). Central opening 66 has precise inner wall surfaces 86 configured to accurately guide packaged semiconductor devices 80 (or alternatively unpackaged semiconductor devices) (see FIGS. 18 and 19) thereinto so that the contact pads 82 of semiconductor device 80 precisely contact the test pads 42 for testing each of the semiconductor devices without the necessity for undue pressure. The placement of the inner wall surface 86 is based on the location of the test pads 42 (in computer memory) rather than the carrier substrate 50, so that accurate positioning is achieved even when the test substrate 40 is joined to the carrier substrate 50 in a less accurate fashion. The outer boundaries 58A of the protective structure 60 are shown as being in agreement with the edges 88 of the carrier substrate 50, but need not be.

If a recoater blade 85 is employed, the process sequence is somewhat different. In this instance, the surface 32 of platform 20 is lowered into liquid material 16 below surface level 18, then raised thereabove until it is precisely a thickness 96 (see FIG. 1A) of layer 64 below recoater blade 85. Recoater blade 85 then sweeps horizontally over the uppermost surface of protective structure 60 on which the next layer is to be formed to remove excess liquid material 16 and leave a film thereof of the precise, desired thickness on the uppermost surface. Platform 20 is then lowered so that the surface of the film and material level 18 are coplanar and the surface of the liquid material 16 is still. Laser 22 is then initiated to scan with laser beam 28 and define the first layer 64 on surface 54 of carrier substrate 50. The process is repeated, layer by layer, to define each succeeding layer 64 and simultaneously bond same to the next lower layer 64 until protective structure 60 is completed. A more detailed discussion of this sequence and apparatus for performing same is disclosed in U.S. Pat. No. 5,174,931, previously incorporated herein by reference. In general, the recoater blade method cannot be used where any portion of test substrate 40, carrier substrate 50, bond wires 56, or another feature of test apparatus 30 protrudes upwardly above the sweeping portion of recoater blade 85. Recoater blade 85 may generally be used for forming only an upper portion of protective structure 60.

As an alternative to the above approach to preparing a layer of liquid material 16 for scanning with laser beam 28, a layer of liquid material 16 may be formed on the test apparatus 30 by lowering platform 20 to flood material over surface 54 or over the highest completed layer 64 of protective structure 60, then raising platform 20 and horizontally traversing a so-called "meniscus" blade across platform 20 (or just across the formed portion of protective structure 60) to form a layer 64 of desired thickness thereabove, followed by initiation of laser 22 and scanning of beam 28 to define the next higher layer of protective structure 60.

As yet another alternative to layer preparation of liquid material 16, platform 20 can be lowered to a depth equal to that of a layer 64 of liquid material 16 to be scanned and a combination flood bar and meniscus bar assembly can be horizontally traversed over platform 20 to substantially concurrently flood liquid material 16 over surface 54 and define a layer 64 of precisely a desired thickness of liquid material 16 for scanning.

All of the foregoing approaches to flooding and layer definition and apparatus of initiation thereof are known in the art, so no further details relating thereto will be provided.

Each layer of structure 60 is preferably built by first defining any internal and external object boundaries 58, 58A of that layer with laser beam 28, then hatching solid areas of protective structure 60 with laser beam 28. If a particular part of a particular layer 64 is to form a boundary 58 of a void in the object above or below that layer, then the laser beam 28 is scanned in a series of closely spaced, parallel vectors so as to develop a continuous surface, or skin, with improved strength and resolution. For example, laser 22 first defines the boundaries 58 of protective structure 60 in first layer 64 and fills in solid portions of layer 64 within boundaries 58 to complete a layer of protective structure 60. Platform 20 is then lowered by a distance substantially equal to a desired thickness of the next, second layer 64, and laser beam 28 scanned over the next, second layer 64 to define boundaries of protective structure 60 therein and to fill in the areas of second layer 64 within boundaries 58 while simultaneously bonding the second layer to the first. Additional layers 64 are then added at least partially atop the previously formed layer as needed to complete protective structure 60. The time it takes to form each layer 64 depends upon its geometry, surface tension and viscosity of material 16, and thickness of the layer.

Once protective structure 60 is completed on test apparatus 30 or another substrate, platform 20 is elevated above surface level 18 of liquid material 16, and the test apparatus 30 may be removed from apparatus 10. Excess, uncured liquid material 16 on the surface of the apparatus 30 may be removed, for example, by a manual removal step and solvent cleaning. Protective structure 60 on each test apparatus 30 may then require postcuring, as material 16 may be only partially polymerized and exhibit only a portion (typically 40% to 60%) of its fully cured strength. Partially consolidated material or unconsolidated material in contact with at least partially consolidated material will eventually cure due to the cross-linking initiated in the outwardly adjacent photopolymer. Postcuring to completely harden protective structure 60 or portions thereof may be accelerated in another apparatus projecting UV radiation in a continuous manner over protective structure 60 and/or by thermal completion of the initial, UV-initiated partial cure.

Figure 7:
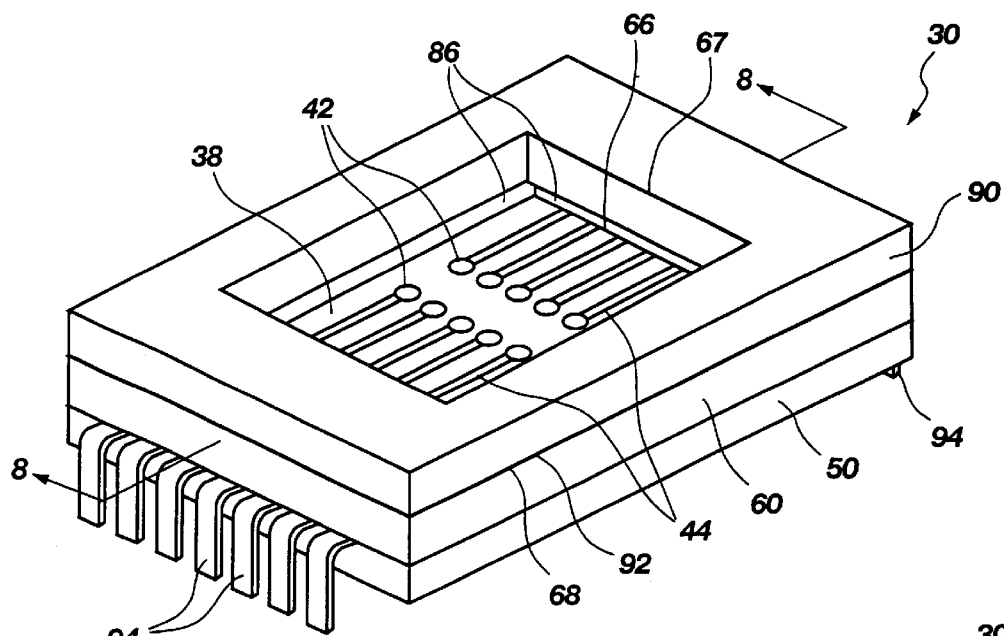
FIG. 7 is a perspective view of one embodiment of a test apparatus of the invention as formed by the method of the invention.
Figure 8:
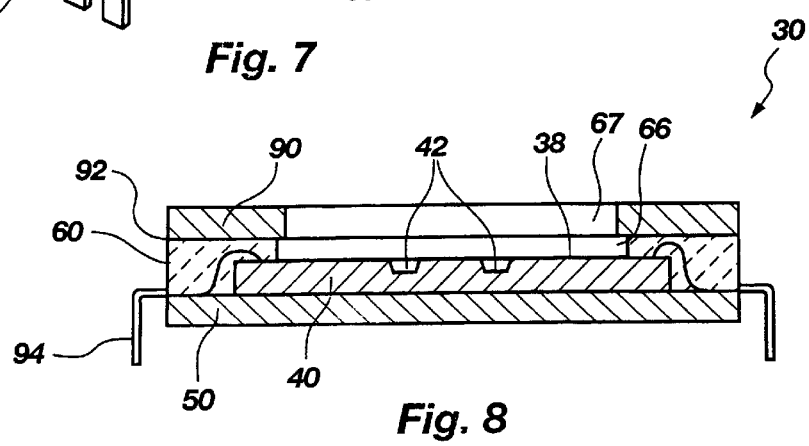
FIG. 8 is a side cross-sectional view of one embodiment of a test apparatus of the invention, as taken along line 8—8 of FIG. 7.

In the embodiment of FIGS. 5 and 6, protective structure 60 is shown as formed to encapsulate and protect bond wires 56 and to provide a top surface 68 to which a preformed fence member 90 may be bonded. In FIGS. 7 and 8, a preformed fence member 90 is shown bonded to top surface 68 with a thin layer 92 of adhesive. Fence member 90 has a central opening 67 that is generally co-aligned with central opening 66 of protective structure 60, although central opening 66 may be larger than central opening 67. Fence member 90 is positioned to provide accurate mating of contact pads on a type of semiconductor device to be tested with corresponding test pads 42.

Fence member 90 may, by way of example and not limitation, be formed of plastic, ceramic, semiconductor material such as silicon, or glass (e.g., borophosphosilicate glass (BPSG), borosilicate glass (BSG), or phosphosilicate glass (PSG)). Alternatively, the stereolithography processes disclosed herein may be used to form a fence member 90 of the desired configuration. When stereolithography is used, fence member 90 can be fabricated separately from test apparatus 30 or protective structure 60, directly on protective structure 60, or integrally with protective structure 60.

The external terminals used with the test apparatus 30 may be of any type which enables reliable electrical connection with test circuitry. Thus, a wide variety of external terminals may be used, including wire-contact pads, solder bumps, tabs, pins, and the like, and are not shown in the drawings with the exception of FIGS. 7 and 8. In FIGS. 7 and 8, external terminals are illustrated as exemplary downformed tab conductors 94.

In practicing the present invention, a commercially available stereolithography apparatus operating generally in the manner as that described with respect to apparatus 10 of FIG. 1 is preferably employed. For example and not by way of limitation, the SLA-250/50HR, SLA-5000 and SLA-7000 stereolithography systems, each offered by 3 D Systems, Inc., of Valencia, Calif., are suitable for practice of the present invention. Photopolymers believed to be suitable for use in practicing the present invention include Cibatool SL 5170 and SL 5210 resins for the SLA-250/50HR system, Cibatool SL 5530 resin for the SLA-5000 system and Cibatool SL 7510 resin for the SLA-7000 system. All of these resins are available from Ciba Specialty Chemicals Corporation. Materials are selected for dielectric constant, sufficient purity (semiconductor grade), adherence to other semiconductor device materials, desirable hardness for physical protection, low shrinkage upon cure, and a coefficient of thermal expansion (CTE) sufficiently similar to that of the test substrate 40 and carrier substrate 50 of test apparatus 30, to which the material is applied. By selecting a photopolymer with a CTE similar to those of substrates 40 and 50, substrates 40 and 50 and the at least partially cured material thereon will not be unduly stressed during thermal cycling in initial testing at elevated temperature and subsequent normal operation as a semiconductor device testing apparatus 30. One area of particular concern in determining resin suitability is the substantial absence of mobile ions and, specifically, fluorides. The layer thickness 96 of material 16 to be formed, for purposes of the invention, may vary widely depending upon the required apparatus height for holding a semiconductor device 80 to be tested, but will enclose bond wires 56 and may be configured to apply a dielectric coating over electrical traces 44 on active surface 38 of test substrate 40 or other protective coating on active surface 38.

The size of the laser beam "spot" 78 impinging on the surface of liquid material 16 to cure same may be on the order of 0.002 inch to 0.008 inch. Resolution is preferably ±0.0003 inch in the X-Y plane (parallel to platform surface 31) over at least a 0.5 inch×0.25 inch field from a center point, permitting a high resolution scan effectively across a 1.0 inch×0.5 inch area. Of course, it is desirable to have substantially this high a resolution across the entirety of surface 54 of a large structure 54 to be scanned by laser beam 28, such area being termed the "field of exposure". The longer and more effectively vertical the path of laser beam 26/28, the greater the achievable resolution.

Referring again to FIG. 1 of the drawings, improved performance of this process is achieved by certain additions to apparatus 10. As depicted, apparatus 10 includes a camera 70 which is in communication with computer 12 and preferably located, as shown, in close proximity to mirror 24 located above test apparatus 30. Camera 70 may be any one of a number of commercially available cameras, such as capacitative-coupled discharge (CCD) cameras available from a number of vendors. Suitable circuitry as required for adapting the output of camera 70 for use by computer 12 may be incorporated in a board 72 installed in computer 12, which is programmed, as known in the art, to respond to images generated by camera 70 and processed by board 72. Camera 70 and board 72 may together comprise a so-called "machine vision system", and specifically a "pattern recognition system" (PkS), the operation of which will be described briefly below for a better understanding of the present invention. Alternatively, a self-contained machine vision system available from a commercial vendor of such equipment may be employed. For example, and without limitation, such systems are available from Cognex Corporation of Natick, Mass. The apparatus of the exemplary Cognex BGA Inspection Package™ or SMD Placement Guidance Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated herein by this reference.

In order to facilitate practice of the method of the present invention with improved apparatus 10, a data file representative of the substrate surfaces 54 on which a protective structure 60 is to be formed is placed in the memory of computer 12. The data file will contain information, such as surface dimensions (in three dimensions) and visual features, as well as spacing and layout of features (e.g., test pads 42, contact pads 48, bond wires 56, and contact pads 52) on test substrate 40 and carrier substrate 50. The data file will also contain information defining boundaries 58, 58A of protective structure 60 to be formed and, in addition, a defined path of laser beam 28 as controlled by mirror 24 to achieve the coverage.

Continuing with reference to FIGS. 1 and 1A of the drawings, a test apparatus 30 on platform 20 may be submerged partially below the surface level 18 of liquid material 16 to a depth the same as, or greater than, the desired thickness 96 of a first layer 64 of material 16 to be at least partially cured to a semisolid state. Then platform 20 is raised to a depth equal to the layer thickness 96 (if previously lowered to a greater depth than a layer thickness) and the surface level 18 of liquid material 16 is allowed to stabilize. The material 16 selected for use in applying a layer 64 to the test apparatus 30 may be one of the above-referenced resins from Ciba Specialty Chemicals Company. Inasmuch as the stereolithography process is conducted without appreciable temperature rise, the need to compensate boundary location (as constructed) for subsequent temperature drop to match semiconductor device dimensions is generally insignificant.

Camera 70 is initiated to locate the position and orientation of each test apparatus 30 on which one or more protective structures 60 are to be formed by scanning platform 20 and comparing the features of test apparatus 30 with those in the data file residing in memory, the locational and orientational data for each test apparatus 30 then also being stored in memory.

Laser 22 is then activated and scanned to direct beam 28, under control of computer 12, across the desired portion of substrate 50 to effect the partial cure of material 16 to form a first layer 64. For forming a second and subsequent layers 64, the platform 20 is lowered into reservoir 14 and raised as before, and the laser activated to form the next layer atop layer 64, for example. It should be noted that the layer thickness 96 of material 16 in a selected portion of a given protective structure 60 may be altered layer by layer, again responsive to output of camera 70 or one or more additional cameras 74 and 76 shown in broken lines, which detect particular features of certain test apparatus 30.

It should be noted that the laser treatment may be carried out to form a boundary 58 which adheres to the substrate surface 54 or the surface of previous layer 64 and the layer within the boundary is lightly cured to form a semisolid "skin" which encloses liquid material 16. The final cure of protective structure 60 may be effected subsequently by broad-source UV radiation in a chamber or by thermal cure in an oven. In this manner, an extremely precise protective structure 60 may be formed in minimal time within apparatus 10.

Figure 9:
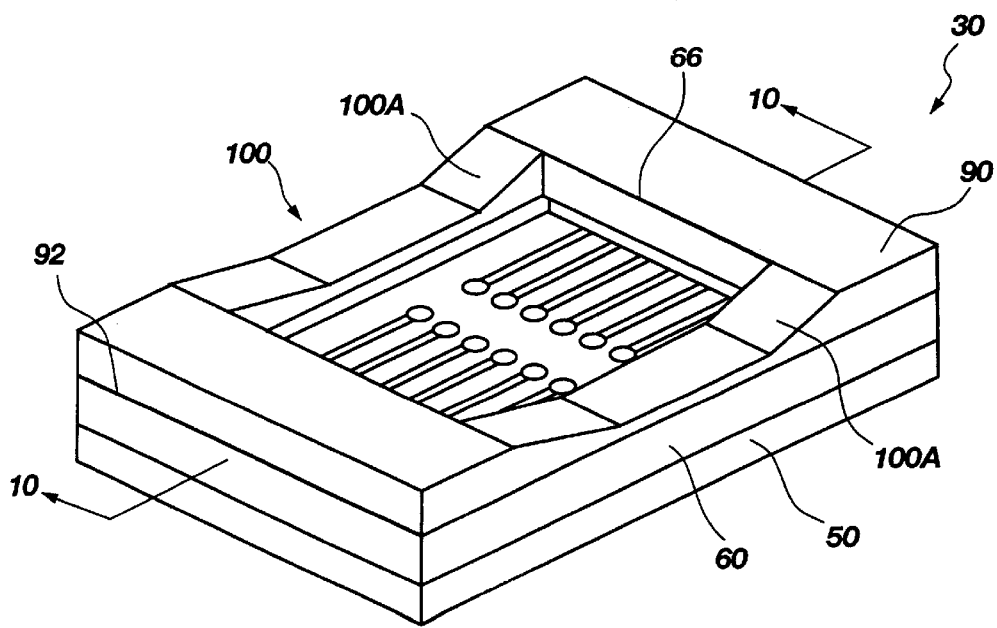
FIG. 9 is a perspective view of another embodiment of a test apparatus of the invention.
Figure 10:
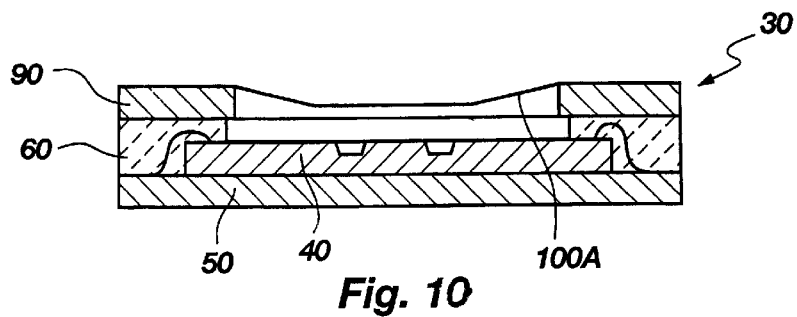
FIG. 10 is a side cross-sectional view of another embodiment of a test apparatus of the invention, as taken along line 10—10 of FIG. 9.
Figure 11:
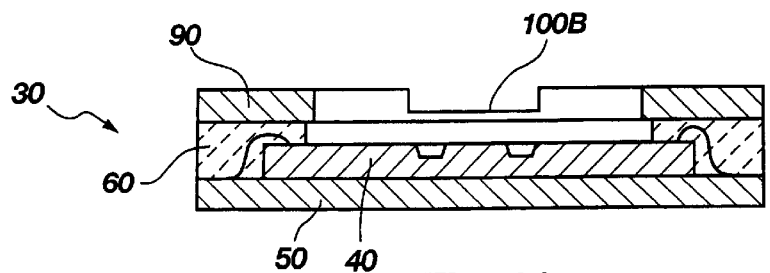
FIG. 11 is a side cross-sectional view of another embodiment of a test apparatus of the invention.

As illustrated in FIGS. 9, 10 and 11, fence member 90 may be configured with portions 100 having reduced elevation. These portions may have any shape, including sloped portions 100A (FIGS. 9 and 10) and slotted portions 100B (FIG. 11). Sloped portions 100A and slotted portions 100B may be useful for manipulation of a semiconductor device (not shown) inserted into central opening 66 of protective structure 60. Use of such portions also reduces the quantity of material used to construct fence member 90.

In another embodiment of the invention, a test apparatus 30 is formed without the use of a preformed fence member 90. Thus, as illustrated in FIGS. 12 through 15, the formation of structure 60 previously shown in FIGS. 5 and 6 is continued to a desirable higher elevation to provide a guide for semiconductor devices 80 inserted into the central opening 66. In this embodiment, use of a separately formed fence member 90 is unnecessary.

Figure 14:
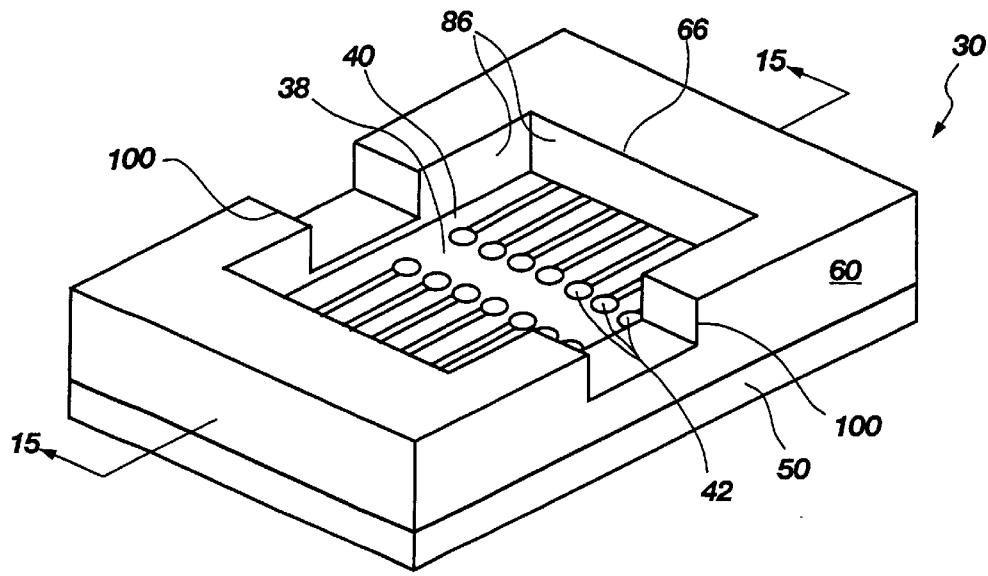
FIG. 14 is a perspective view of another embodiment of a test apparatus of the invention.
Figure 15:
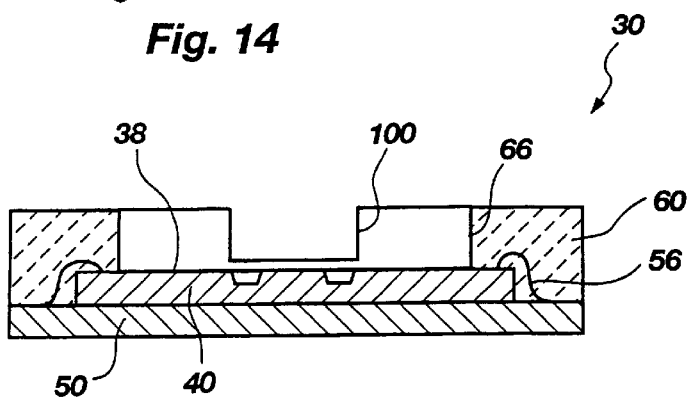
FIG. 15 is a side cross-sectional view of another embodiment of a test apparatus of the invention, as taken along line 15—15 of FIG. 14.

In FIGS. 14 and 15, a test apparatus 30 is shown with cut-out wall portions 100 (100A, 100B) as previously described.

Figure 16:
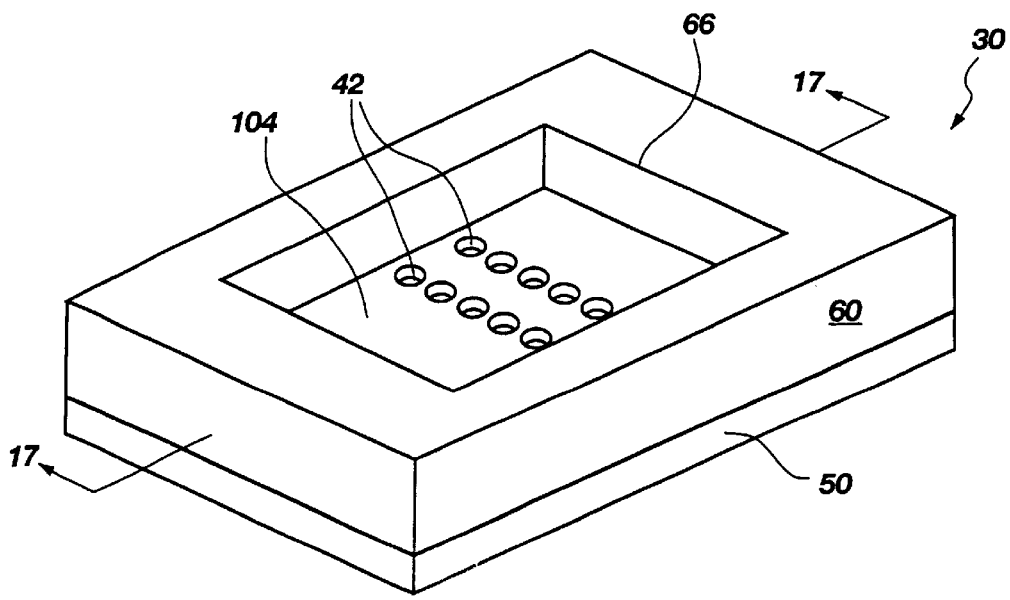
FIG. 16 is a perspective view of an additional embodiment of a test apparatus of the invention.
Figure 17:
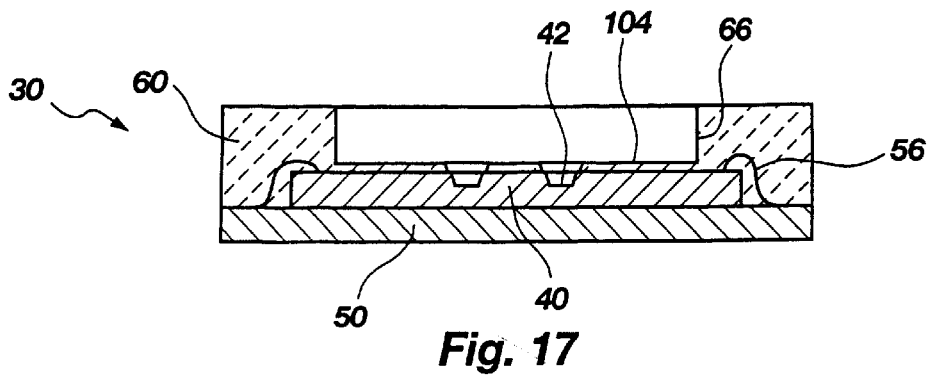
FIG. 17 is a side cross-sectional view of an additional embodiment of a test apparatus of the invention, as taken along line 17—17 of FIG. 16.

As depicted in FIGS. 16 and 17, protective structure 60 may include a thin layer 104 of dielectric material formed over an inner portion of active surface 38 of test substrate 40 to protect active surface 38, including electrical traces 44 (not shown) from damage or shorts under repeated use. Layer 104 may also be useful for protecting a semiconductor device during assembly thereof with test apparatus 30. While layer 104 may be formed by conventional methods, this invention encompasses the incorporation of its construction as a part of the stereolithography process. Layer 104 can have one or two sublayers of material that are at least partially cured to give layer 104 a thickness of about 10 to about 50 μm, but layer 104 may have any thickness that will permit the formation of electrical connections between test substrate 40 and conductive elements of a semiconductor device to be assembled therewith. As shown, the test pads 42 are left uncovered, eliminating any additional step to remove cured material therefrom. The methodology is incorporated as a STL file into the total stereolithography program.

Figure 12:
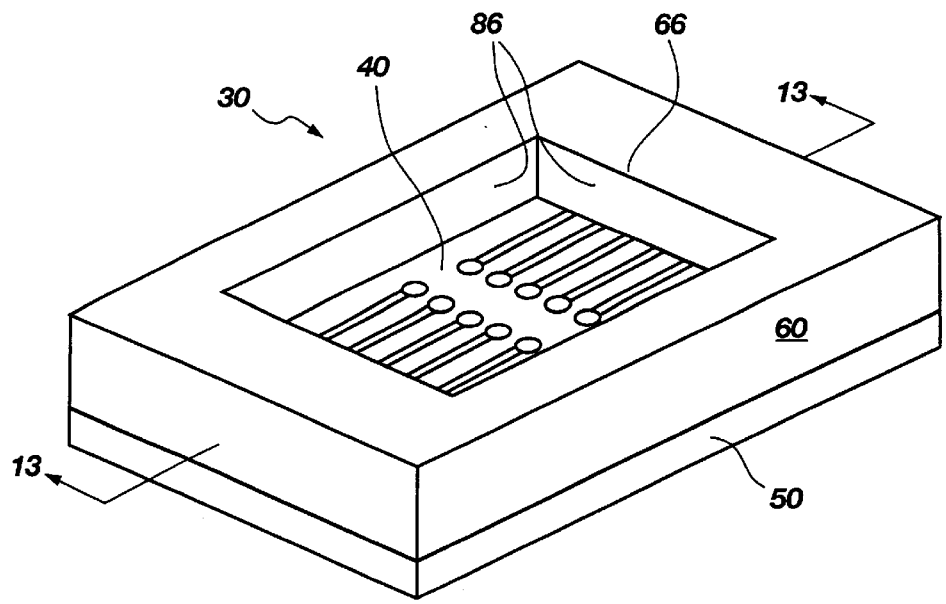
FIG. 12 is a perspective view of a further embodiment of a test apparatus of the invention.
Figure 13:
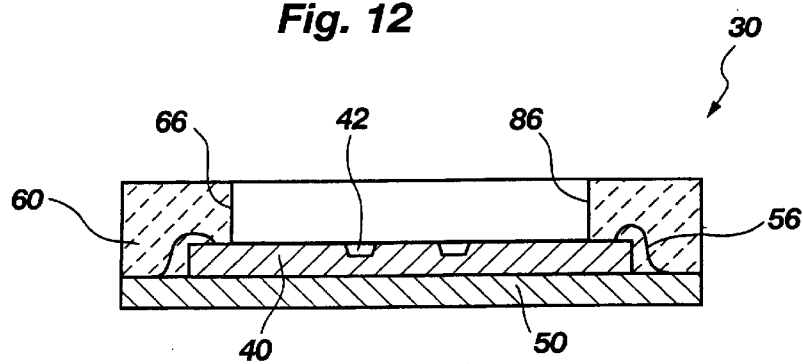
FIG. 13 is a side cross-sectional view of a further embodiment of a test apparatus of the invention, as taken along line 13—13 of FIG. 12.
Figure 18:
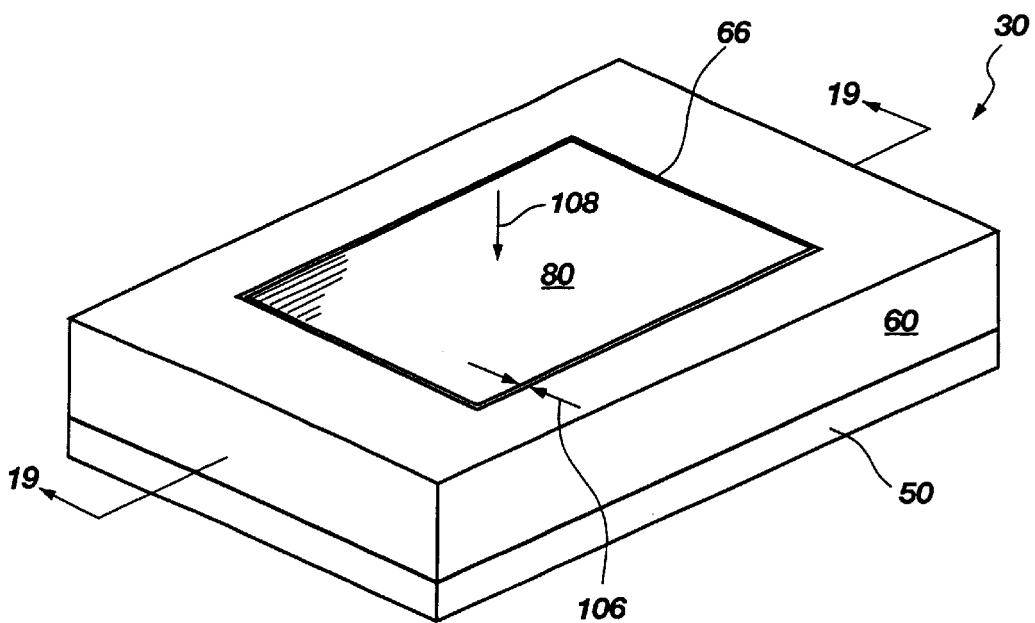
FIG. 18 is a perspective view of a test apparatus of the invention with a semiconductor device to be tested inserted into the test apparatus.
Figure 19:
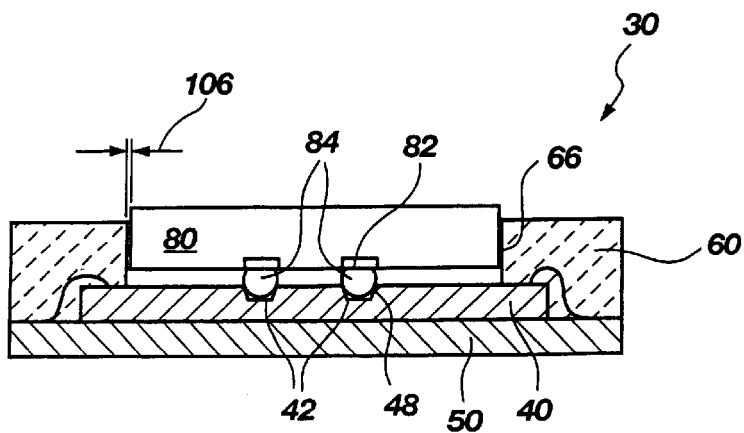
FIG. 19 is a side cross-sectional view of a test apparatus of the invention with a semiconductor device therein, as taken along line 19—19 of FIG. 18.

FIGS. 18 and 19 show a completed test apparatus (exterior terminals not shown) of the type illustrated in FIG. 12, with a semiconductor device 80 inserted therein for testing. In addition, the gap 106 between the central opening 66 and the semiconductor device 80 is precisely configured to facilitate insertion of semiconductor device 80 into central opening 66 and to align contact pads 82 of semiconductor device 80 or other conductors communicating therewith and the corresponding test pads 42. In the various embodiments of this invention, a minimum of downward force 108 is required to maintain electrical contact between all contact pads 82 of semiconductor device 80 and the corresponding test pads 42 of test substrate 40. If conductors, such as the illustrated solder balls 84, protrude from contact pads 82 of semiconductor device 80, the conductors 84 need not be deformed to provide a sufficient electrical connection.

It should be noted that in any of the embodiments described thus far, the inner wall surfaces 86 of central opening 66 may be vertical, sloped slightly inward, sloped slightly outward, or undercut (e.g. see FIG. 7). In addition, as shown in FIG. 20, wall surfaces 86 may have vertically extending slots 98, or notches. Such slots 98 reduce the frictional forces in inserting or removing a semiconductor device 80 to be tested and also result in material savings, weight reduction, and reduced manufacturing time.

Also shown in FIG. 20 are various optional open spaces 102 in protective structure 60, which result in weight, material and time savings. The open spaces 102 may be located anywhere in protective structure 60, so long as their location does not hinder the testing of semiconductor devices 80 or reduce the useful life of test apparatus 30. Each of these features is incorporated into the STL data file.

It is notable that the present invention provides a rapid method for forming structures of protective material precisely on specified areas of a test apparatus 30. The method is frugal of material 16, since all such material in which cure is not initiated by laser beam 28 remains in a liquid state in reservoir 14 for continued use.

The method of the present invention is conducted at substantially ambient temperature, the small laser beam spot 78 size and rapid traverse of laser beam 28 on test substrate 40, carrier substrate 50, bond wires 56, and other features of test apparatus 30 resulting in negligible thermal stress thereon.

Furthermore, forming a protective structure 60 on a test apparatus 30 by stereolithographic processes is advantageous in that such processes enhance the precision of material placement and the precision with which structures of desired dimensions can be fabricated, reduces fabrication time, reduces subsequent packaging costs, and enables computer control of the protective structure fabrication process using commercially available equipment.

Referring to FIGS. 1 through 20 of the drawings, it will be apparent to the reader that the present invention involves a substantial departure from prior applications of stereolithography, in that the structures of preformed electrical components are modified by forming multilayered structures thereon using computer-controlled stereolithography. Moreover, the use of stereolithography facilitates the fabrication of protective structures 60 that have different configurations and are made from different materials than existing bond wire protective structures.

It should be re-emphasized that the stereolithographic technique of the present invention is suitable for covering, or leaving uncovered, any desired portion of a substrate, so that electrical connections for connection to semiconductor devices and other devices may be left bare, eliminating a material removal step.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method for fabricating at least one protective structure for at least one bond wire, comprising:

providing a three-dimensional solid computer model of the at least one protective structure, said model having a plurality of sequential, contiguous, superimposed slices;

forming at least one layer comprising a material in an unconsolidated state on a surface of a supporting structure; and selectively altering the state of said material of said at least one layer to an at least semisolid state in accordance with at least one slice of said plurality of slices to form an at least semisolid region of said at least one layer.

2. The method of claim 1, further comprising:

forming, over said at least one layer, a second layer comprising a material in an unconsolidated state; and selectively altering the state of said material of said second layer to an at least semisolid state in accordance with a second slice of said plurality of slices to form an at least semisolid region of said second layer, said at least semisolid region of said second layer being superimposed over said at least semisolid region of said at least one layer.

3. The method of claim 2, wherein said forming said second layer comprises forming said second layer to have a different thickness than said at least one layer.

4. The method of claim 3, wherein said selectively altering the state of said material of said second layer comprises securing said at least semisolid region of said second layer to said at least semisolid region of said at least one layer.

5. The method of claim 1, wherein said forming said at least one layer comprises disposing a photopolymer in a liquid state on said surface.

6. The method of claim 1, wherein said selectively altering comprises directing a controllable beam of radiation onto selected areas of said at least one layer.

7. The method of claim 6, wherein said selectively altering comprises directing ultraviolet radiation onto said selected areas.

8. The method of claim 1, wherein said selectively altering comprises selectively altering said material located at at least one boundary of a structure to be fabricated adjacent said at least one bond wire.

9. The method of claim 8, wherein said selectively altering further comprises, following said selectively altering said material located at said at least one boundary, selectively altering said material within confines of said at least one boundary.

10. The method of claim 1, further comprising removing at least some of said material remaining in said unconsolidated state from the at least one protective structure.

11. The method of claim 10, further comprising further curing at least said material in said at least said semisolid state.

12. The method of claim 11, wherein said further curing comprises heating at least said material in said at least said semisolid state.

13. The method of claim 11, wherein said further curing comprises exposing at least said material in said at least said semisolid state to ultraviolet radiation.

* * * * *

UNITED STATES PATENT AND TRADEMARK OFFICE
CERTIFICATE OF CORRECTION

PATENT NO.   : 6,537,842 B2
DATED        : March 25, 2003
INVENTOR(S)  : Salman Akram It is certified that error appears in the above-identified patent and that said Letters Patent is hereby corrected as shown below:

Column 2,
Line 60, insert a period after "thereof"

Column 5,
Line 53, change "inventions;" to -- invention; --

Column 8,
Line 64, insert a hyphen between "temperature" and "induced"

Column 9,
Line 36, insert a period after "thereof"

Column 13,
Line 20, after "structure" delete "54"
Line 39, change "(PkS)" to -- (PRS) --

Signed and Sealed this

Twenty-fourth Day of June, 2003

JAMES E. ROGAN
*Director of the United States Patent and Trademark Office*